United States Patent
Wu

(10) Patent No.: US 9,621,115 B1
(45) Date of Patent: Apr. 11, 2017

(54) AMPLIFIER DEVICES WITH IN-PACKAGE TRANSMISSION LINE COMBINER

(71) Applicant: FREESCALE SEMICONDUCTOR INC., Austin, TX (US)

(72) Inventor: Yu-Ting D. Wu, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/966,922

(22) Filed: Dec. 11, 2015

(51) Int. Cl.
*H03F 1/07* (2006.01)
*H03F 1/02* (2006.01)
*H03F 1/56* (2006.01)
*H03F 3/193* (2006.01)
*H03F 3/21* (2006.01)

(52) U.S. Cl.
CPC ........... *H03F 1/0288* (2013.01); *H03F 1/565* (2013.01); *H03F 3/193* (2013.01); *H03F 3/211* (2013.01); *H03F 2200/451* (2013.01); *H03F 2203/21106* (2013.01); *H03F 2203/21139* (2013.01)

(58) Field of Classification Search
CPC .................................. H03F 1/07; H03F 1/0288
USPC .............................................. 330/295, 124 R
See application file for complete search history.

(56) References Cited

U.S. PATENT DOCUMENTS

| | | | | |
|---|---|---|---|---|
| 5,973,567 A * | 10/1999 | Heal | ....................... | H01L 23/66 330/277 |
| 6,833,761 B2 * | 12/2004 | Staudinger | .............. | H03F 3/602 330/302 |
| 7,078,976 B2 | 7/2006 | Blednov | | |
| 8,487,703 B2 | 7/2013 | Blednov | | |
| 8,653,889 B1 * | 2/2014 | Acimovic | ............. | H03F 1/0288 330/124 R |
| 8,717,099 B2 * | 5/2014 | Wilson | .................. | H03F 1/0288 330/124 R |
| 8,717,102 B2 * | 5/2014 | Wilson | .................... | H03F 3/193 330/124 R |

OTHER PUBLICATIONS

J.H. Qureshi, et al., "A Wide-Band 20W LMOS Doherty Power Amplifier," in IEEE MTT-S International Microwave Symposium Digest, Anaheim, CA, May 2010, pp. 1504-1507.

* cited by examiner

*Primary Examiner* — Henry Choe

(57) ABSTRACT

The embodiments described herein include amplifiers that are typically used in radio frequency (RF) applications. The amplifiers described herein use a combiner that is implemented inside the device package. Specifically, the amplifiers can be implemented with a combiner that includes a transmission line inside the device package, where the transmission line has a length between first and second ends configured to provide an impedance inverter between the outputs (e.g., drain terminals) of transistors in the amplifier.

19 Claims, 4 Drawing Sheets

AMPLIFIER DEVICES WITH IN-PACKAGE TRANSMISSION LINE COMBINER

TECHNICAL FIELD

Embodiments of the subject matter described herein relate generally to amplifiers, and more particularly to radio frequency (RF) power amplifiers used in a variety of applications.

BACKGROUND

In general, amplifiers are used to increase the power of signals. For example, amplifiers can be used to convert low-power radio frequency (RF) signals into larger RF signals for driving the antenna of a transmitter. In such cases, amplifiers may be implemented as part of overall power amplifier used by an RF transmission system.

Power amplifiers tend to consume a significant portion of the total power consumed by a transmission system. Therefore, the power amplifier's efficiency (i.e., the power of the amplifier output signal divided by the total power consumed by the amplifier) is an amplifier quality that designers consistently strive to increase.

However, amplifier bandwidth is also an important parameter to consider, and many amplifier designs with high theoretical power efficiencies may have characteristically lower fractional bandwidths, where the fractional bandwidth is the bandwidth of the amplifier divided by the center frequency of the amplifier. Therefore, there remains a need for amplifiers that provide both relatively high efficiency and relatively high fractional bandwidth.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein can provide semiconductor devices, and particularly amplifiers, with improved performance. For example, the embodiments described herein include amplifiers that are typically used in radio frequency (RF) applications. The amplifiers described herein use a combiner that is implemented inside the device package in a way that facilitates improved amplifier bandwidth. Specifically, the amplifiers can be implemented with a combiner that includes a transmission line inside the device package, where the transmission line has a length between first and second ends configured to provide an impedance inverter between the outputs (e.g., drain terminals) of transistors in the amplifier. So configured, the combiner can facilitate an amplifier with a relatively high fractional bandwidth and relatively high efficiency. Furthermore, such an amplifier can be provided with a reduced size and more consistent circuit performance.

Figure 1:
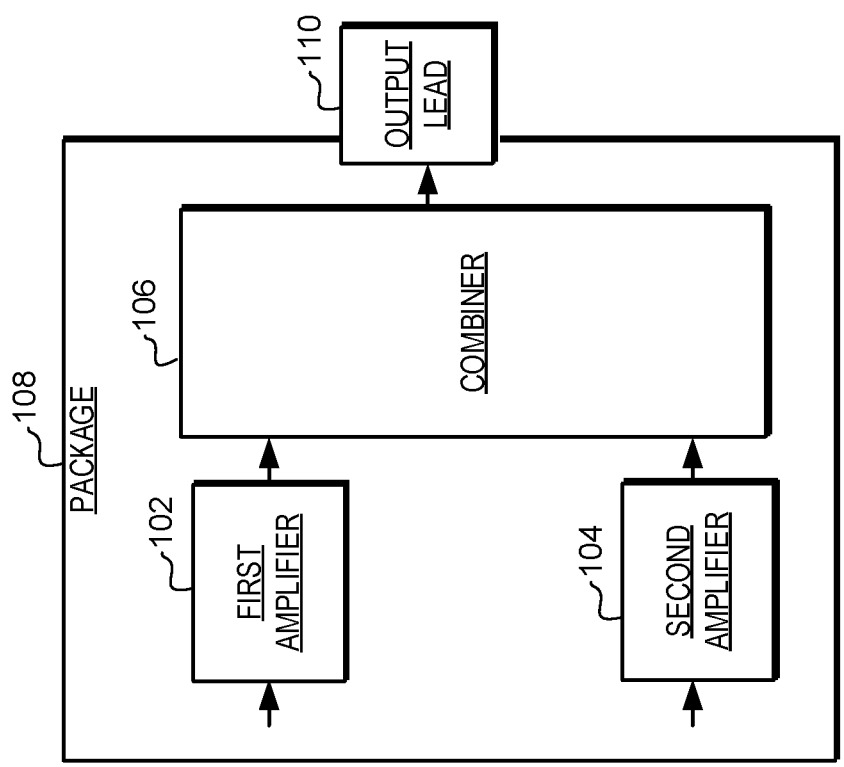
FIG. 1 is a schematic diagram of a portion of an amplifier in accordance with an example embodiment.

Turning now to FIG. 1, a schematic diagram of a portion of an exemplary amplifier 100 is illustrated. The amplifier 100 includes a first amplifier 102 (including one or more first transistors), a second amplifier 104 (including one or more second transistors), a combiner 106, a package 108, and an output lead 110. It should be noted that amplifier 100 is a simplified representation of a portion of an amplifier, and in a more typical implementation the amplifier would include additional features not illustrated in FIG. 1. Also, as used herein, the term "package" means a collection of structural components (e.g., including a flange or substrate) to which the primary electrical components (e.g., input and output leads, amplifiers 102, 104, combiner 106, and various electrical interconnections) are coupled, where a "package" is a distinct device that may be coupled to a printed circuit board (PCB) or other substrate that includes other portions of the amplifier.

In accordance with the embodiments described herein, the first amplifier 102 includes a first amplifier output and the second amplifier 104 includes a second amplifier output. The combiner 106 is coupled to the first amplifier output and the second amplifier output and the output lead 110. As described above, the combiner 106 includes a transmission line having a length configured to provide an impedance inverter between the first amplifier output and the second amplifier output. Specifically, the transmission line, together with intrinsic capacitances of the transistors within the amplifiers 102, 104 and inductances in the various connections provides the impedance inverter between the first amplifier output and the second amplifier output. As will be described in greater detail below, the use of this transmission line as part of the combiner 106 and inside the package 108 can provide the amplifier 100 with improved bandwidth and associated improvements in performance.

In one embodiment, the combiner 106 comprises a first set of bond wires, a second set of bond wires, and the transmission line. In this embodiment, the first set of bond wires couple the first amplifier 102 output to the transmission line and the second set of bond wires couples the second amplifier 104 output to the transmission line, and again the transmission line has a length configured to provide, in combination with the first transistor parasitic capacitance, the second transistor parasitic capacitance, the first set of bond wires and the second set of bond wires, an impedance inverter between the first transistor output and the second transistor output. Additionally, in some embodiments a third set of bond wires is provided, where the third set of bond wires couple the transistor outputs to the output lead 110.

In one specific embodiment, the amplifier 100 comprises a portion of a Doherty amplifier that uses a carrier amplifier 102 and one or more peaking amplifiers 104 coupled in parallel to provide parallel amplification paths. In general, Doherty amplifiers use separate amplifiers to amplify a carrier signal and one or more peaking signals. In such an embodiment, the carrier amplifier 102 can comprise one or more transistors (e.g., including a driver transistor and a final stage transistor), and the peaking amplifier 104 can comprise one or more other transistors (e.g., including a driver transistor and a final stage transistor). Although single stage (e.g., single transistor) carrier and peaking amplifiers are illustrated in some of the figures, it should be understood that other embodiments include multiple-stage amplifiers (e.g., in which each amplification path includes a driver amplifier (transistor) and a final-stage amplifier (transistor) coupled in series). Additionally, some embodiments can include multiple peaking amplifiers coupled in parallel with the carrier amplifier to increase power capacity. In this embodiment, the combiner 106 can be implemented with the transmission line inside the package 108 and between the outputs of the carrier amplifier 102 and the one or more peaking amplifiers 104. Examples of such Doherty amplifier implementations will be described in greater detail below.

As noted above, the combiner 106 includes a transmission line, and the transmission line has a length configured to provide impedance inverter between the output of the first amplifier 102 and the output of the second amplifier 104. As will be described in greater detail below, using such an impedance inverter can improve efficiency at the operational frequency by providing an optimal load to the first transistor during operation.

As the term is used herein, a transmission line is defined as a conductive line or other conductive element that has a specific characteristic impedance and effective electrical length for specific RF frequency transmissions. Such a transmission line can be implemented in a variety of ways. For example, the transmission line can be implemented as one or more conductive features within an integrated passive device (IPD). As another example, the transmission line can be implemented as one or more conductive traces defined in and or on a PCB. In each of these embodiments the transmission line can be formed on a substrate that is distinct from the die(s) on which the transistors (e.g., first transistor(s) of the carrier amplifier 102 and second transistor(s) of the peaking amplifier 104) are formed. Finally, it should be noted that the various embodiments provide the ability to bias the transistors (e.g., the transistors of the first and second amplifiers 102, 104) using a shared drain bias circuit that is coupled to the both a drain of the carrier transistor and a drain of the peaking transistor to provide a shared bias voltage to the carrier transistor and the peaking transistor.

Again, it should be noted that this use of a transmission line as part of the combiner 106, and inside the package 108, can provide the amplifier 100 with improved bandwidth. Specifically, compared to solutions that use lumped elements outside of the package 108 to combine the signals, the amplifier 100 can provide a significant increase in fractional bandwidth. In some embodiments such an amplifier can provide up to about 20% fractional bandwidth or greater. This increase in fractional bandwidth, as compared with conventional amplifiers, can occur because a reduced phase shift can be achieved between the intrinsic nodes of the transistors (e.g., transistors of amplifiers 102 and 104) and nodes of the combiner 106. Furthermore, this increased fractional bandwidth can be provided while also providing an optimal load to the first amplifier 102 during operation.

Figure 2:
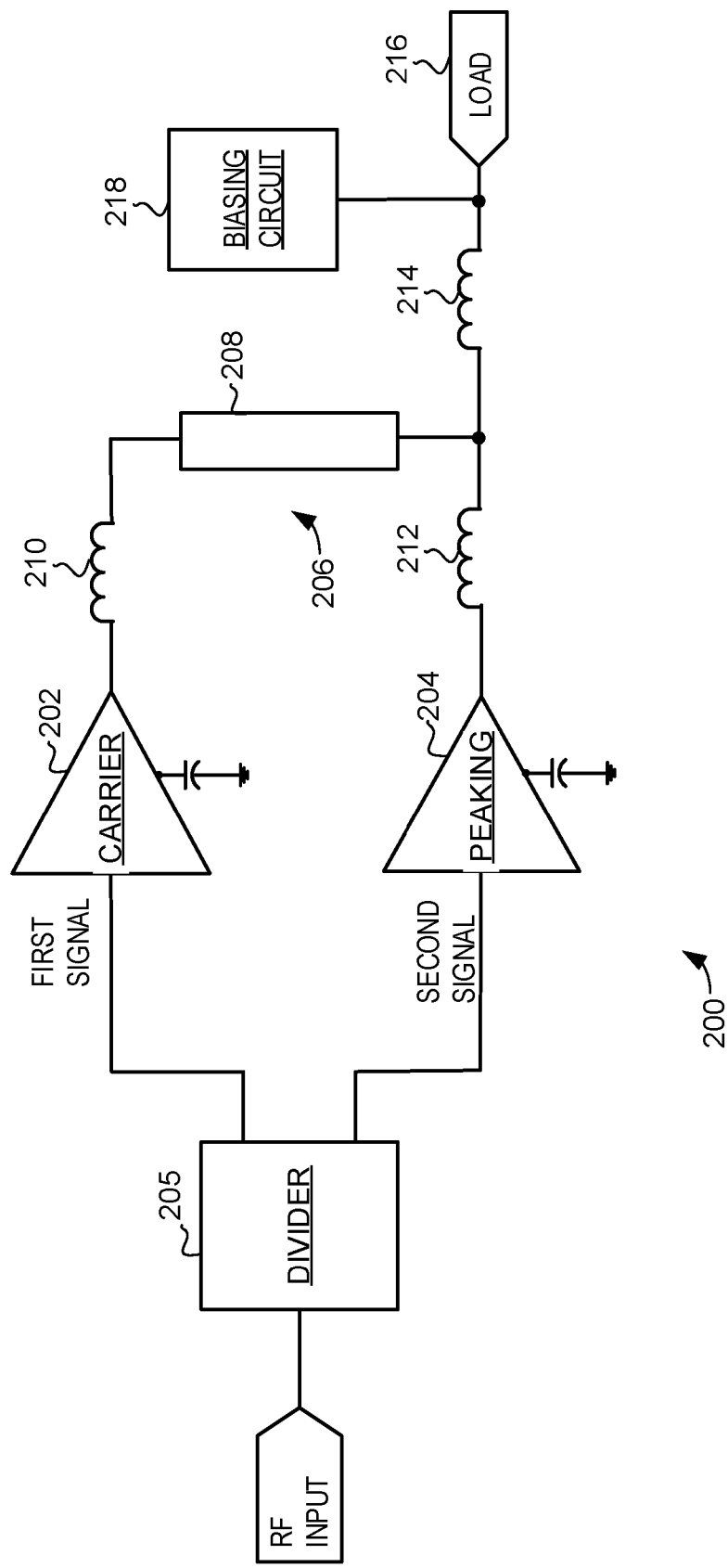
FIG. 2 is a circuit diagram of a portion of an exemplary Doherty amplifier in accordance with an example embodiment.

Turning now to FIG. 2, a circuit diagram representing a portion of an exemplary amplifier 200 is illustrated. In this illustrated embodiment, the amplifier 200 is a Doherty amplifier that receives an RF input and drives an amplified signal to a load 216 (e.g., an antenna). The amplifier 200 includes a carrier amplifier 202, a peaking amplifier 204, a divider 205, and a combiner 206.

In general, the divider 206 receives an RF signal and generates two outputs that are 90 degrees out of phase with each other. These two outputs correspond to the first signal and second signal that are applied to the carrier amplifier 202 and peaking amplifier 204 respectively. The two outputs can be in the form of equal-power or unequal-power signals. The 90 degree phase difference can be provided by a phase delay element that applies a phase shift of about 90 degrees before outputting to the peaking amplifier 204. During operation, the 90 degree difference in phase allows the output of the peaking amplifier 204 to be in step with the carrier amplifier 202 output when combined by in the combiner 208. As one example, the divider 205 can be implemented with a power splitter and phase delay element, for example, implemented within the package or on a PCB to which the illustrated portion of the amplifier 200 is coupled.

The carrier amplifier 202 can includes one or more carrier transistors, and the peaking amplifier 204 can includes one or more peaking transistors, with the outputs of the carrier and peaking transistors coupled to the combiner 206. Conceptually, the combiner 206 can be considered to include a transmission line 208 and inductances 210 and 212. This combiner 206 serves to the combine the outputs of the final (or single) stage carrier transistor in the carrier amplifier 202 and peaking transistor in the peaking amplifier 204 such that the combined output can be delivered to the load 216. To facilitate that this, the combiner 206 is coupled to the load 216 through inductance 214.

The combiner 206 also provides an impedance inverter between the outputs of the carrier amplifier 202 and the peaking amplifier 204. Using the combiner 206 to provide an impedance inverter between the amplifiers 202 and 204 can improve efficiency at the operational frequency of the amplifier 200. Specifically, the efficiency can be improved at both back-off and peak power. During operation, the impedance inverter effectively changes the impedance seen by the carrier amplifier 202 to provide an optimal load to the carrier amplifier 202 at and around the operational frequency. This effectively adjusts the output of the peaking amplifier 204, and thus improves the efficiency of the amplifier 200.

In one typical embodiment, the inductances 210 and 212 in the combiner 206 can be provided by bond wire arrays used to couple the amplifiers 202 and 204 (e.g., drain terminals of the associated transistors) to the transmission line 208. For example, in a typical embodiment, the carrier amplifier 202, the peaking amplifier 204 and the transmission line 208 are provided on separate semiconductor dies or substrates. Providing the transmission line 208 on a die or substrate that is separate from the active die(s) on which the carrier amplifier 202 and peaking amplifier 204 reside can enable the use of different frequency and power levels when compared to a fully integrated implementation. Specifically, the thickness and material properties of the dies or substrates used for amplifiers 202 and 204 and the transmission line 208 can each be selected based on their individual frequency and power requirements. More specifically, in some embodiments the dielectric thickness and constant used in the die or other substrate of the transmission line 208 can be specifically selected for optimal performance of the combiner 206. In such an embodiment, the separate dies or substrates would be packaged together in one device package, with the connection between dies and/or substrates in the package provided by bond wires. Thus, the bond wires can provide at least part of the inductances represented by inductances 210 and 212. Of course, it should be noted that other elements can provide all or part or all of those inductances in other embodiments.

Likewise, the inductance 214 can be provided by bond wires used to couple the transmission line 208 to a package lead (e.g., an output lead). That package lead can then provide the connection to the load 216 and a biasing circuit 218. It should be noted that in this embodiment, the biasing circuit 218 provides a shared bias voltage to the drains of transistors in both the carrier amplifier 202 and the peaking amplifier 204. An example of such a shared bias voltage will be discussed with reference to FIG. 4. In alternate embodiments, the amplifier may include separate biasing circuits and/or one or more bias leads that are distinct from the output lead.

In a typical embodiment, the carrier amplifier 202 and peaking amplifier 204 would be implemented with suitable RF-capable transistors with relatively high power capability. For example, the carrier amplifier 202 and peaking amplifier 204 can be implemented with Gallium Nitride (GaN) transistors or laterally diffused metal oxide semiconductor (LDMOS) transistors. In any event, the "input" of such a transistor is the control terminal (e.g., a gate terminal, "G") of the transistor, and the "output" of a transistor is a current carrying terminal (e.g., a drain terminal, "D", or source terminal, "S") of the transistor. In various embodiments, the other current carrying terminal (e.g., the source or drain terminal) is coupled to a ground node of the device (e.g., to the device package substrate or flange).

It should be noted that because the transmission line 208 is inside the package, the inductances 210 and 212 can be relatively small compared to conventional amplifiers in which the combiner and its associated connections are made outside the package. Furthermore, by adjusting the electrical length (between first and second ends of the transmission line 208) and number of bond wires the values of the inductances 210 and 212 can be selected to provide an accurate impedance inverter at the operational frequency.

Specifically, the transistors implementing the carrier amplifier 202 and peaking amplifier 204 can each have intrinsic capacitances, such as drain-to-source capacitance ($C_{DS}$). These intrinsic capacitances are inherent in the transistors, and in implementing the combiner 206 the effects of the intrinsic capacitances are taken into account. This can be accomplished by selecting appropriate configurations for the inductances 210 and 212 and the transmission line 208. Specifically, the length of the transmission line 208 and physical characteristics of the bond wires used to couple the transmission line 208 to the transistors 202 and 204 are selected to account for the intrinsic capacitances $C_{DS}$ of the transistors in the amplifiers 202 and 204 in providing the impedance inverter.

Specifically, in one example the electrical length of the transmission line 208 and the inductances of the bond wires are selected such that the total phase shift provided by the transmission line 208 and the bond wire inductances between the outputs of the carrier amplifier 202 and peaking amplifier 204 is about 90 degrees and thus the combination of the transmission line 208 and the bond wires behaves as an impedance inverter. For example, in typical implementations the transmission line 208 may have a length (between first and second ends) that is less than about ¼ wavelength of an RF signal at a center operational frequency of the amplifier 200, where the bond wires will provide the additional inductances needed for effective impedance inverting at that frequency. However, the exact division between bond-wire inductance and transmission line impedance will typically depend on the specific implementation and frequency. In one embodiment the transmission line length is configured to provide between about 45 degrees to about 80 degrees of phase shift. Such an embodiment can be provided by implementing the transmission line 208 to have a length between about 0.5 to about 0.9 of ¼ wavelength of an RF signal at a center operational frequency of the amplifier.

Furthermore, in one embodiment the length and shape of the individual bond wires can be used to provide phase compensation. For example, an array of graded bond wires can be used. In graded bond wires the length of the individual bond wires varies in from one end of the array to the other. For example, the individual bond wires can have a longer length near the end of the transmission line, and can get progressively shorter the closer to the center. Such a grading of the bond wires in the vertical dimension can be used to provide phase compensation of the signals in the combiner, and again can provide improved performance compared to a device that uses only lumped elements that are external to the package as a combiner.

The transmission line 208 can be implemented in a variety of ways. As a first example, the transmission line 208 can be implemented as one or more conductors in an integrated passive device (IPD). In general, IPDs are formed using wafer-level or die-level fabrication techniques such as photolithography. Thus, in such an example, the transmission line 208 can be formed on a wafer by depositing and patterning a conductive material to have the selected length and other desirable features. The wafer is then singulated to define a separate die that includes the transmission line 208, and that die is packaged (e.g., coupled to the package flange or substrate) with the other elements of the amplifier 200. In such an embodiment the electrical connection between the formed transmission line 208 on the die and the other elements (e.g., transistors 202 and 204) can be provided by bond wires.

As a second example, the transmission line 208 can be implemented as a conductor defined on a PCB substrate. In such an example, the transmission line 208 can be printed on the PCB substrate to have the selected length, and then placed in the package (e.g., coupled to the package flange or substrate) with the other elements of the amplifier 200. Again, in such an embodiment the connections between the printed transmission line 208 and the other elements (e.g., transistors 202 and 204) can be provided by bond wires.

As a more particular example, the transmission line 208 can be implemented with a microstrip line. In general, a microstrip line is a type of transmission line that includes a conductive strip that is separated from a ground plane by a dielectric layer. Microstrip lines can be formed on a variety of substrates, including PCB substrates and semiconductor wafer/die substrates, and with a variety of manufacturing techniques. In any of these embodiments, the microstrip line is formed with a length selected to provide a portion of an impedance inverter between the transistor outputs. In such an example, the transmission line 208 can be formed as a microstrip line of the selected length, and then placed in the package with other elements of the amplifier 200. In such an embodiment the connections between the printed transmission line 208 and the other elements (e.g., amplifiers 202 and 204) can again be provided by bond wires.

Figure 3:
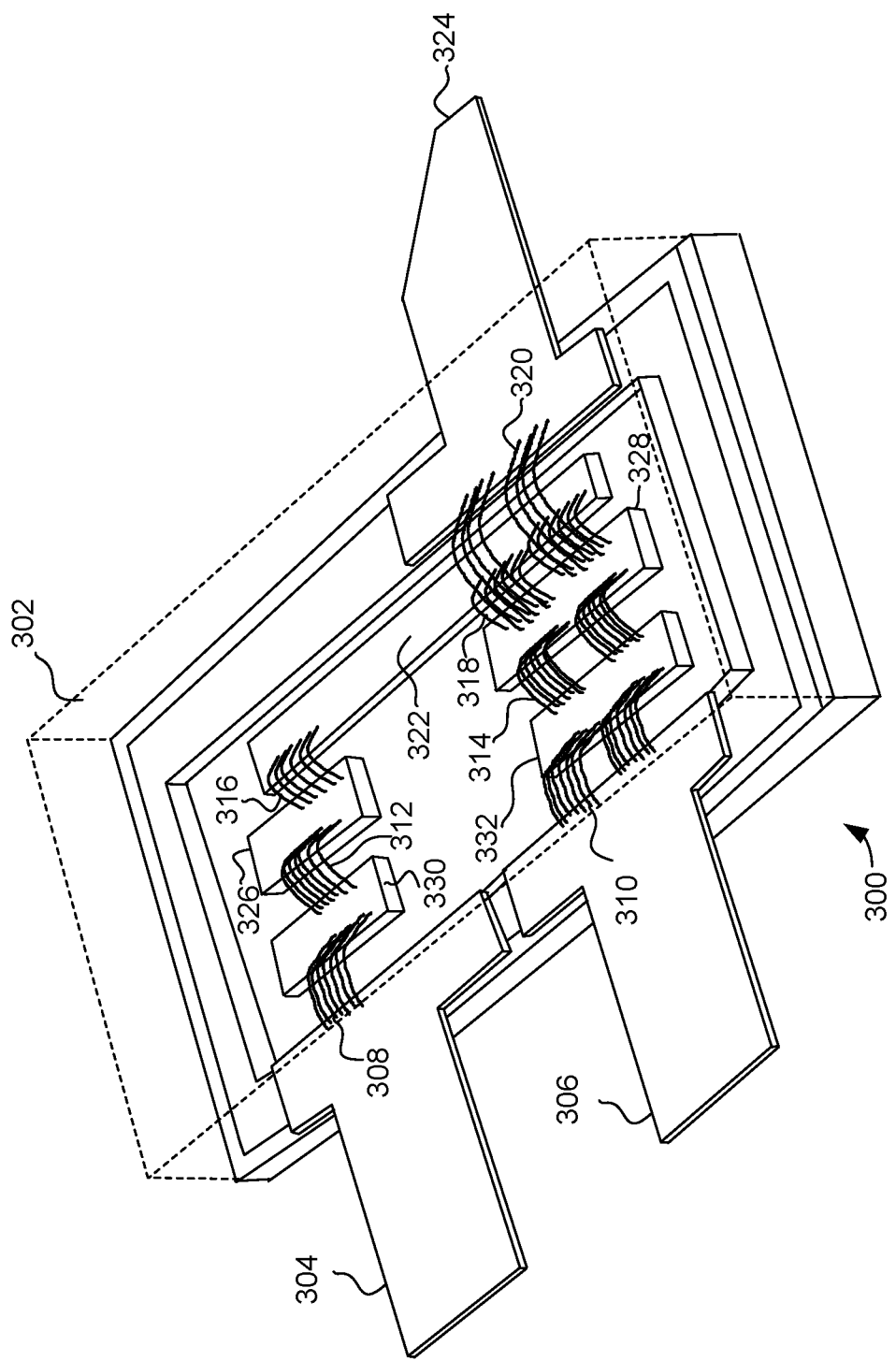
FIG. 3 is a perspective, cut-away view of an exemplary packaged device that includes a portion of an amplifier in accordance with an example embodiment.

Turning now to FIG. 3, a perspective, cut-away view of an exemplary device 300 that includes a portion of an amplifier 300 is illustrated. The device 300 includes a package 302, input leads 304 and 306, bond wire arrays 308, 310, 312, 314, 316, 318 and 320, a transmission line 322 and an output lead 324. Also included are a carrier transistor die 326, a peaking transistor die 328, and capacitor die 330 and 332, with the capacitor die 330 and 332 forming portions of input matching networks. Furthermore, it should again be noted that device 300 is a simplified representation of a portion of an amplifier, and in a more typical implementation the amplifier would include additional features not illustrated in FIG. 3. The package 302 includes a package substrate (e.g., formed of PCB materials with various conductive features) or flange (e.g., a rigid conductive component) to which the transistor die 326, 328, capacitors 330, 332, and the transmission line 322 (e.g., a substrate or IPD that includes the transmission line 322) are coupled. The package substrate or flange may provide an electrical ground reference for the device (e.g., for the capacitors 330, 332 and for the transistor die 326, 324 (e.g., more specifically to the sources of the carrier and peaking transistors). The package 302 also may include an isolator that electrically isolates the package substrate or flange from the leads 304, 306, 324, or alternatively may include encapsulation that provides such electrical isolation. The package 302 may be an air-cavity package or an overmolded (encapsulated) package, in various embodiments.

In this implementation the first input lead 304 is configured to receive a carrier signal, and the second input lead 306 is configured to receive a peaking signal. The bond wires 308, 312 and the capacitor 330 form portions of a first input matching network coupled between the input lead 304 and the input (e.g., gate) of the carrier transistor die 326. The bond wires 316 couple the output (e.g., drain) of the carrier transistor die 326 to the transmission line 322.

Likewise, the bond wires 310, 314 and the capacitor 3332 form portions of a second input matching network coupled between the second input lead 306 and the input (e.g., gate) of the peaking transistor die 3. The bond wires 318 couple the output (e.g., drain) of the peaking transistor die 328 to the transmission line 322. Finally, the bond wires 320 couple the outputs of the carrier transistor die 326 and peaking transistor die 328 to the output lead 324. More specifically, in the illustrated embodiment, bond wires 320 coupled the output of the peaking transistor die 328 to the output lead 324 (and the output of the carrier transistor die 326 is coupled to the output of the peaking transistor die 328 through the transmission line 322. It should be noted that the number and arrangement of bond wires would be selected based on the power handling requirements and the desired inductance of the bond wires. Thus, for connections that require more power handling ability (e.g., connections to the peaking transistor) more bond wires can be provided. Further, although the carrier and peaking transistor die 326, 328 are illustrated as separate die, an alternate embodiment may have the carrier and peaking transistors implemented on a single die.

As is clearly indicated in FIG. 3, bond wires 316 are coupled to a first end of transmission line 322, and bond wires 318 are coupled to a second end of transmission line 322. The second end of transmission line 322 further is coupled (through bond wires 318 and 320 to the output lead 324. Accordingly, the output signal from the carrier transistor on the carrier transistor die 326 travels through bond wires 316, through the transmission line 322 from the first end to the second end, and through bond wires 318 to the output of the peaking transistor on the peaking transistor die 328. In this manner, the combination of the bond wires 316, the length of the transmission line 322 (between first and second ends), and the bond wires 318 provide the impedance inversion (and about 90 degree phase delay) to the signal produced at the output of the carrier transistor. The output of the peaking transistor on the peaking transistor die 328 serves as the combining node for the output carrier and peaking signals. As discussed previously, since about a 90 degree phase delay had been provided to the peaking signal prior to amplification, the output carrier and peaking signals are combined in-phase at the combining node (e.g., at the output of the peaking transistor). In an alternate embodiment, the combining node may be implemented at the second end of the transmission line 322, rather than at the output of the peaking transistor. In such an embodiment, bond wires 320 would be coupled between the second end of the transmission line 322 and the output lead 324.

In this embodiment, the bond wires 316 and 318, and the transmission line 322 can be considered to be part of a combiner (e.g., combiner 206) that serves to the combine the output signals produced by the carrier transistor and peaking transistor such that the combined output can be delivered to the load output lead 324. It should be noted that the bond wires 316 and 318, and the transmission line 322 are encased in the package 302 with the carrier transistor die 326 and peaking transistor die 328. Configured in this way, the combiner facilitates a Doherty amplifier that has a relatively high fractional bandwidth. Furthermore, because the transmission line 322 may be on a separate substrate (e.g., die) from the transistor die 326, 338, the use of different frequencies and power levels in the various die or substrates are enabled.

It should be noted that while this example shows a single input lead 306 corresponding to a single peaking transistor, in other embodiments multiple peaking transistors and corresponding multiple input leads 306 can be used.

Figure 4:
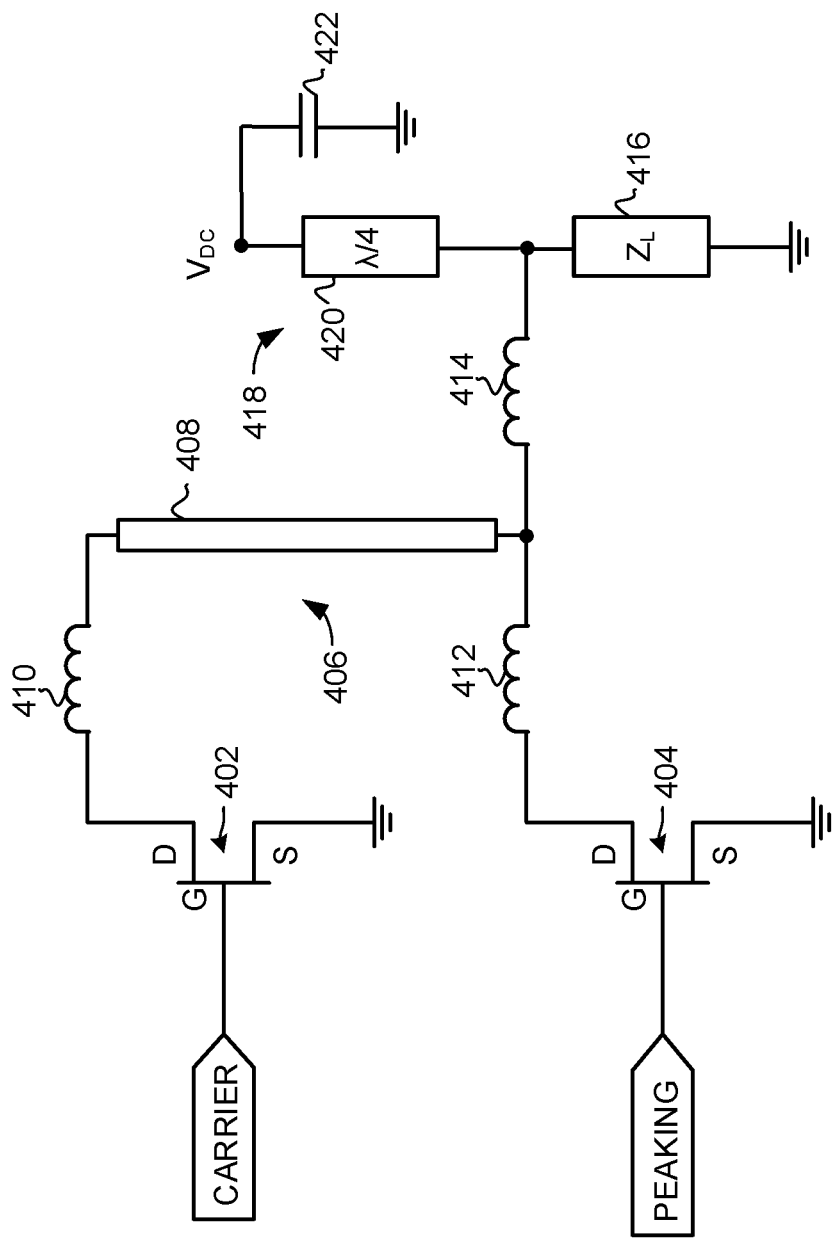
FIG. 4 is a circuit diagram of a portion of an exemplary Doherty amplifier in accordance with an example embodiment.

Turning now to FIG. 4, a circuit diagram representing a portion of an exemplary amplifier 400 is illustrated. In this illustrated embodiment, the amplifier 400 is again a Doherty amplifier that receives a carrier signal and a peaking signal and drives a combined signal to a load 416. The amplifier 400 includes one or more carrier transistors 402, one or more peaking transistors 404 and a combiner 406. And again, the combiner 406 can be considered to include a transmission line 408 and inductances 410 and 412. This combiner 406 again serves to the combine the output signals produced by the carrier transistor 402 and peaking transistor 404 such that the combined output can be delivered through inductance 414 to the load 416.

In this illustrated embodiment, a biasing circuit 418 is coupled to the inductance 414. The biasing circuit 418 includes a DC voltage source $V_{DC}$, a quarter-wave transformer 420, and a capacitor 422 coupled to ground. In such an embodiment, the biasing circuit 418 provides a DC bias voltage to both the drain of the carrier transistor 402 and the drain of the peaking transistor 404. The quarter-wave transformer 420 acts to provide an open circuit to the output lead at the operational frequency $1/\lambda$, preventing the RF energy from flowing through the biasing circuit 418 to ground. Likewise, the capacitor 422 prevents the DC bias voltage from shorting to ground. It should be noted that in this embodiment, the biasing circuit 418 provides a shared DC bias voltage $V_{DC}$ to the drains of both the carrier transistor 402 and the peaking transistor 404. Having the common bias voltage $V_{DC}$ applied to both transistors through a shared input can provide improved ease of biasing and reduced bias network complexity.

The embodiments described herein can provide semiconductor devices, and particularly amplifiers, with improved performance. For example, the embodiments described herein include amplifiers that are typically used in radio frequency (RF) applications. Specifically, the amplifiers described herein use a combiner that is implemented inside the device package in a way that facilitates improved amplifier bandwidth. Specifically, the amplifiers can be implemented with a combiner that includes a transmission line inside the device package, where the transmission line has a length between first and second ends that is configured to provide an impedance inverter between the outputs of transistors in the amplifier. So configured, the combiner can facilitate an amplifier with a relatively high fractional bandwidth and relatively high efficiency. Furthermore, such an amplifier can be provided with a reduced size and more consistent circuit performance.

Various modifications may be made to the above-described and illustrated embodiments without departing from the scope of the inventive subject matter. For example, although conventional Doherty amplifier implementations are discussed above (e.g., in which a 90 degree phase delay is applied to the input peaking signal prior to amplification, and a corresponding 90 degree phase delay is applied to the output carrier signal after amplification to ensure that the amplified carrier and peaking signals are combined in phase), other embodiments may include an "inverted" Doherty amplifier implementation (e.g., in which a 90 degree phase delay is applied to the input carrier signal prior to amplification, and a corresponding 90 degree phase delay is applied to the output peaking signal after amplification). Further, as mentioned above, embodiments include single-stage and multiple-stage amplifiers. Also, the main and peaking transistors may be implemented on separate die or on the same die, in various embodiments.

In one embodiment an amplifier is provided, where the amplifier comprises a device package including an output lead and at least one input lead, the device package encasing: a first amplifier with a first transistor including a first transistor output; a second amplifier with a second transistor including a second transistor output; and a combiner coupled to the first transistor output and the second transistor output, the combiner including a transmission line having a length configured to provide at least a portion of an impedance inverter between the first transistor output and the second transistor output.

In another embodiment an amplifier is provided, where the amplifier comprises a device package including an output lead and at least one input lead, the device package encasing: a carrier amplifier, the carrier amplifier including a carrier transistor with a carrier transistor parasitic capacitance and a carrier transistor output; a peaking amplifier, the peaking amplifier including a peaking transistor with a peaking transistor parasitic capacitance and a peaking transistor output; and a combiner, the combiner comprising a first set of bond wires, a second set of bond wires, and a transmission line, wherein the first set of bond wires couples the carrier transistor output to a first end of the transmission line, and the second set of bond wires couples the peaking transistor output to a second end of the transmission line, and wherein the transmission line has a length between the first end and the second end configured to provide, in combination with the carrier transistor parasitic capacitance, the peaking transistor parasitic capacitance, the first set of bond wires and the second set of bond wires, an impedance inverter between the carrier transistor output and the peaking transistor output.

In another embodiment an amplifier is provided, where the amplifier comprises a device package including an output lead and at least one input lead, the device package encasing: a carrier transistor including a carrier transistor parasitic capacitance and a carrier transistor output; a peaking transistor including a peaking transistor parasitic capacitance and a peaking transistor output; a transmission line having a length, the transmission line formed on a substrate distinct from a die on which the carrier transistor is formed, the peaking transistor is formed, or both the carrier and peaking transistors are formed; a first set of bond wires coupling the carrier transistor output to a first end of the transmission line; a second set of bond wires coupling the peaking transistor output to a second end of the transmission line; and a third set of bond wires coupling the peaking transistor output to the output lead, and wherein a transmission line length between the first and second ends is configured to provide an impedance inverter between the carrier transistor output and the peaking transistor output in combination with the carrier transistor parasitic capacitance, the peaking transistor parasitic capacitance, the first set of bond wires and the second set of bond wires.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier comprising:
a device package including an output lead and at least one input lead, the device package encasing:
a first amplifier with a first transistor including a first transistor output;
a second amplifier with a second transistor including a second transistor output; and
a combiner coupled to the first transistor output and the second transistor output, the combiner including a transmission line having a length configured to provide at least a portion of an impedance inverter between the first transistor output and the second transistor output, wherein the impedance inverter is configured to compensate for a first transistor parasitic capacitance and a second transistor parasitic capacitance, and wherein the impedance inverter further includes a first set of bond wires and a second set of bond wires.

2. The amplifier of claim 1, wherein the combiner is coupled to the first transistor output through the first set of bond wires coupled to a first end of the transmission line and wherein the combiner is coupled to the second transistor output through the second set of bond wires coupled to a second end the transmission line.

3. The amplifier of claim 2, further comprising a third set of bond wires coupling the second transistor output to the output lead.

4. The amplifier of claim 1, wherein the amplifier comprises a Doherty amplifier, and wherein the first amplifier comprises a carrier amplifier and wherein the second amplifier comprises a peaking amplifier in the Doherty amplifier.

5. The amplifier of claim 1, wherein the transmission line comprises a conductor defined on a printed circuit board (PCB).

6. The amplifier of claim 1, wherein the transmission line comprises a conductive feature of an integrated passive device (IPD).

7. The amplifier of claim 1, wherein the transmission line comprises a microstrip line.

8. The amplifier of claim 1, wherein the transmission line is formed on a substrate distinct from a die on which either the first transistor is formed, the second transistor is formed, or both the first and second transistor is formed.

9. The amplifier of claim 1, wherein the transmission line has a length between 0.5 to 0.9 of a ¼ wavelength of a radio frequency (RF) signal at a center operational frequency of the amplifier.

10. The amplifier of claim 1, further comprising a biasing circuit, the biasing circuit coupled to both the first transistor output and the second transistor output to provide a shared bias voltage to the first transistor and the second transistor.

11. An amplifier comprising:
a device package including an output lead and at least one input lead, the device package encasing:
a carrier amplifier, the carrier amplifier including a carrier transistor with a carrier transistor parasitic capacitance and a carrier transistor output;
a peaking amplifier, the peaking amplifier including a peaking transistor with a peaking transistor parasitic capacitance and a peaking transistor output; and
a combiner, the combiner comprising a first set of bond wires, a second set of bond wires, and a transmission line, wherein the first set of bond wires couples the carrier transistor output to a first end of the transmission line, and the second set of bond wires couples the peaking transistor output to a second end of the transmission line, and wherein the transmission line has a length between the first end and the second end configured to provide, in combination with the carrier transistor parasitic capacitance, the peaking transistor parasitic capacitance, the first set of bond wires and the second set of bond wires, an impedance inverter between the carrier transistor output and the peaking transistor output.

12. The amplifier of claim 11, further comprising a third set of bond wires coupling the peaking transistor output to the output lead.

13. The amplifier of claim 11, wherein the transmission line comprises a conductor defined on a printed circuit board (PCB).

14. The amplifier of claim 11, wherein the transmission line comprises a conductive feature of an integrated passive device (IPD).

15. The amplifier of claim 11, wherein the transmission line comprises a microstrip line.

16. The amplifier of claim 11, wherein the transmission line is formed on a substrate distinct from a die on which either the carrier transistor is formed, the peaking transistor is formed, or both the carrier and peaking transistor are formed.

17. The amplifier of claim 11, further comprising a biasing circuit, the biasing circuit coupled to both a drain of the carrier transistor and a drain of the peaking transistor to provide a shared bias voltage to the carrier transistor and the peaking transistor.

18. The amplifier of claim 11, wherein the transmission line has a length between 0.5 to 0.9 of a ¼ wavelength of an RF signal at a center operational frequency of the amplifier.

19. A Doherty amplifier, comprising:
a device package including an output lead and at least one input lead, the device package encasing:
a carrier transistor including a carrier transistor parasitic capacitance and a carrier transistor output;
a peaking transistor including a peaking transistor parasitic capacitance and a peaking transistor output;
a transmission line having a length, the transmission line formed on a substrate distinct from a die on which the carrier transistor is formed, the peaking transistor is formed, or both the carrier and peaking transistors are formed;
a first set of bond wires coupling the carrier transistor output to a first end of the transmission line;
a second set of bond wires coupling the peaking transistor output to a second end of the transmission line;
a third set of bond wires coupling the peaking transistor output to the output lead; and
wherein a transmission line length between the first and second ends is configured to provide an impedance inverter between the carrier transistor output and the peaking transistor output in combination with the carrier transistor parasitic capacitance, the peaking transistor parasitic capacitance, the first set of bond wires and the second set of bond wires.

* * * * *